United States Patent
Hartmann

(10) Patent No.: US 6,650,577 B2
(45) Date of Patent: Nov. 18, 2003

(54) INTEGRATED SEMICONDUCTOR MEMORY HAVING MEMORY CELLS IN A PLURALITY OF MEMORY CELL ARRAYS AND METHOD FOR REPAIRING SUCH A MEMORY

(75) Inventor: Udo Hartmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/905,858

(22) Filed: Jul. 13, 2001

(65) Prior Publication Data

US 2002/0009003 A1 Jan. 24, 2002

(30) Foreign Application Priority Data

Jul. 13, 2000  (DE) .......................................... 100 34 062

(51) Int. Cl.$^7$ ................................................. G11C 7/00
(52) U.S. Cl. ...................................... 365/200; 365/201
(58) Field of Search ........................... 365/200, 51, 63, 365/201, 225.7

(56) References Cited

U.S. PATENT DOCUMENTS

| | | | | |
|---|---|---|---|---|
| 3,701,116 A | * | 10/1972 | de Haan | 365/200 |
| 4,398,248 A | * | 8/1983 | Hsia et al. | 365/200 |
| 5,357,473 A | * | 10/1994 | Mizuno et al. | 365/200 |
| 5,563,832 A | * | 10/1996 | Kagami | 365/200 |

FOREIGN PATENT DOCUMENTS

| | | |
|---|---|---|
| WO | PCT/DE98/02589 | 3/1999 |
| WO | 19744095 A1 | 4/1999 |

OTHER PUBLICATIONS

Masashi Horiguchi et al.: "A Flexible Redundancy Technique for High–Density DRAM's", IEEE Journal of Solid–State Circuits, vol. 26, No. 1, Jan. 1991, pp. 12–17.

* cited by examiner

Primary Examiner—Tan T. Nguyen
(74) Attorney, Agent, or Firm—Laurence A. Greenberg; Werner H. Stemer; Gregory L. Mayback

(57) ABSTRACT

An integrated semiconductor memory includes memory cells in a plurality of memory cell arrays disposed on a semiconductor chip in levels running above one another. A plurality of the memory cells are respectively combined to form normal units of memory cells, as well as redundant units of memory cells for replacing a respective one of the normal units. The normal units and the redundant units respectively include memory cells from memory cell arrays in a plurality of the levels. In the case of a faulty memory cell, the relevant normal unit is replaced by one of the redundant units. This permits a reduced number of programmable elements to be used for programming the redundant memory cells to repair the memory. A method for repairing such a memory is also provided.

7 Claims, 2 Drawing Sheets

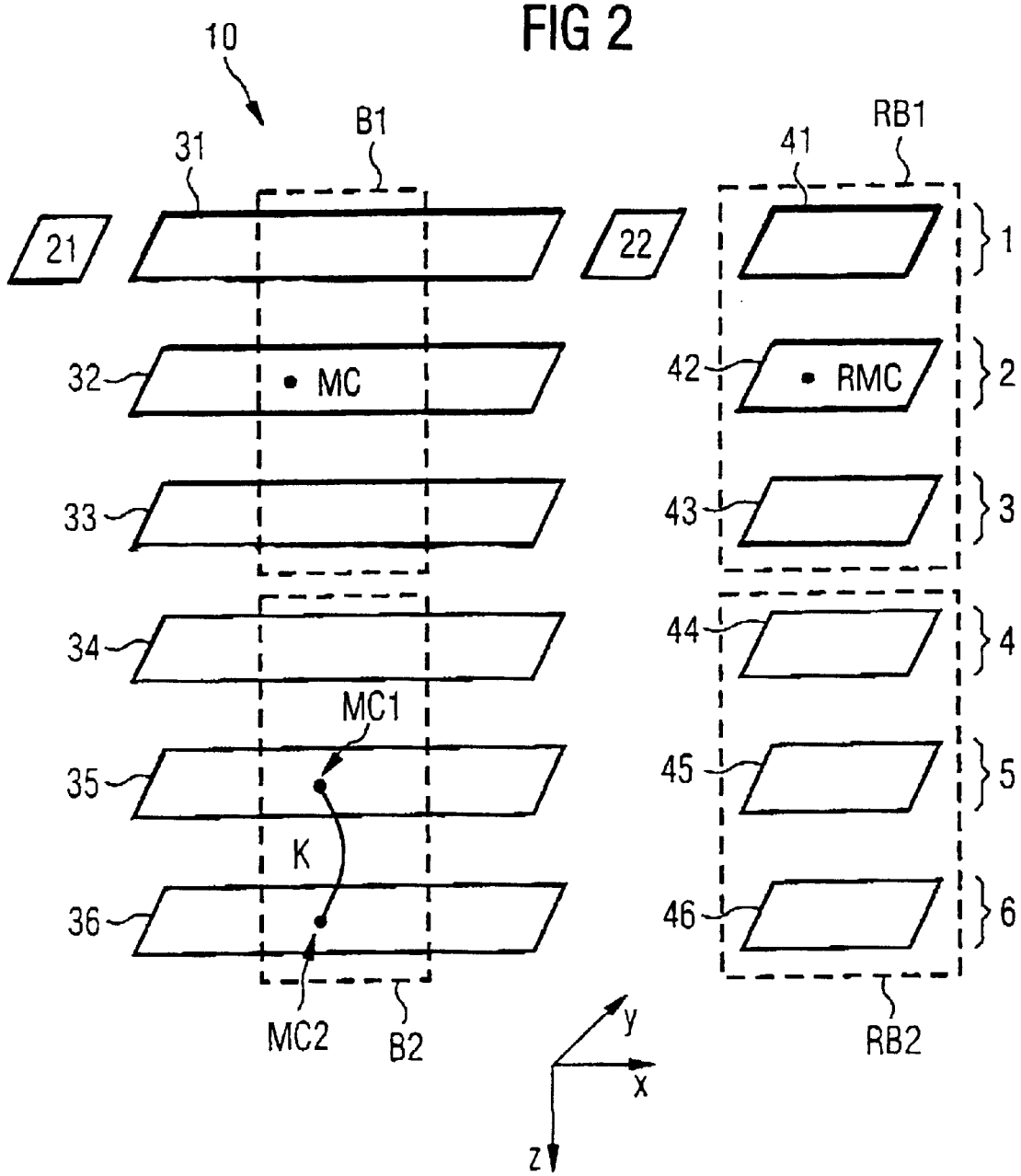

INTEGRATED SEMICONDUCTOR MEMORY HAVING MEMORY CELLS IN A PLURALITY OF MEMORY CELL ARRAYS AND METHOD FOR REPAIRING SUCH A MEMORY

BACKGROUND OF THE INVENTION

Field of the Invention

The present invention relates to an integrated semiconductor memory having memory cells respectively disposed in a plurality of memory cell arrays. The memory cell arrays are disposed on a semiconductor chip in respective levels running above one another. The invention also relates to a method for repairing such a memory.

In order to repair faulty memory cells in a memory cell array, integrated semiconductor memories, such as DRAM memories, generally have redundant units of memory cells which are able to replace normal units of memory cells containing faulty memory cells, by addressing. The memory cells are usually combined in the memory cell array to form units of individual or a plurality of row lines and column lines, and of redundant row lines and redundant column lines.

The integrated memory is tested by using an external test device, for example, and the redundant elements are then programmed. In that case, a redundancy circuit has programmable elements, e.g. in the form of laser fuses or electrically programmable fuses, which are used for storing the address of a unit to be replaced. They are usually disposed in "fuse banks" and are programmed by using a laser beam or a "burning voltage", for example in the course of the manufacturing process after the memory has been tested. When the memory is operating, in the course of a memory access operation, the normal units to be replaced are replaced by the appropriate redundant units by addressing, using an appropriate redundancy circuit.

An "MRAM" memory containing memory cells with a magnetoresistive memory effect is known from International Publication No. WO 99/14760, corresponding to U.S. application Ser. No. 09/528,159, filed Mar. 17, 2000. The memory cells have ferromagnetic layers with a state which can be altered in order to store data signals. The memory cells are respectively connected between one of the row lines and one of the column lines and are electrically connected to the respective column line and row line. In that case, the memory cells with a magnetoresistive memory effect have a higher impedance than the row lines and column lines. The column lines are connected to a sense amplifier in order to read a data signal from a selected memory cell.

Since such an MRAM memory contains no selection transistors connecting the memory cells to the respective column line on the basis of the addressing for the purpose of reading or writing a data signal, particular advantages are obtained for the geometric configuration of the memory cells. Thus, the memory cells can be placed in different memory cell arrays disposed on the semiconductor chip in respective levels running above one another. Such a stacked configuration of the memory cell arrays allows a considerable space saving to be achieved.

If the memory repair technology known for DRAM memories is used on such an MRAM memory, then each of the individual memory cell arrays generally needs to be provided with a redundancy circuit containing fuse banks for replacing memory cells in the relevant memory cell array. Programmable elements such as laser fuses generally cannot be provided in a stacked configuration for accessibility reasons. That means that, with a relatively high number of redundant units of memory cells for the individual memory cell arrays, a memory containing fuse banks disposed next to one another generally requires a relatively large amount of space which in some cases can once again eliminate the space saving accomplished by the stacked memory cell arrays.

SUMMARY OF THE INVENTION

It is accordingly an object of the invention to provide an integrated semiconductor memory having memory cells in a plurality of memory cell arrays and a method for repairing such a memory, which overcome the hereinafore-mentioned disadvantages of the heretofore-known devices and methods of this general type, in which normal memory cells and redundant memory cells are provided and in which a comparatively space-saving circuit configuration for programming the redundant memory cells for repairing the memory is made possible.

With the foregoing and other objects in view there is provided, in accordance with the invention, an integrated semiconductor memory, comprising memory cells disposed in a plurality of memory cell arrays and a semiconductor chip on which the memory cell arrays are disposed in levels extended above one another. The memory cells include a plurality of memory cells combined to form normal units of memory cells. The memory cells include a plurality of memory cells combined to form redundant units of memory cells each for replacing a respective one of the normal units. The normal units and the redundant units each have memory cells of the memory cell arrays in a plurality of the levels.

With the objects of the invention in view, there is also provided a method for repairing an integrated semiconductor memory, which comprises testing the memory cells in the memory cell arrays for freedom from fault. Memory cells detected as faulty are replaced with redundant memory cells. A respective normal unit containing a memory cell detected as faulty is replaced with one of the redundant units, upon detecting at least one faulty memory cell.

The invention can be applied to any integrated semiconductor memories which have a plurality of memory cell arrays in respective levels running above one another. Such a configuration can be used, in particular, in MRAM memories. In particular, such a memory has memory cells with a magnetoresistive memory effect which are respectively connected between one of a plurality of column lines and one of a plurality of row lines of the respective memory cell array.

Combining memory cells into normal units and redundant units respectively including memory cells in a plurality of levels makes it possible to reduce the number of programmable elements required for programming overall. By way of example, it is not necessary to provide a dedicated fuse bank for a respective memory cell array. For example, the normal units and redundant units respectively include memory cells from four memory cell arrays disposed above one another. In this case, the number of fuse banks to be provided can be reduced by a factor of four, since a redundant unit includes memory cells not just from one memory cell array but rather from four memory cell arrays. If one of the normal units in this case has at least one faulty memory cell, the relevant normal unit is replaced by one of the redundant units. Therefore, in the example, memory cells in all four memory cell arrays are replaced together by one redundant unit.

In this context, the invention uses the realization that, for example in the case of an MRAM memory having memory cell arrays which are in a stacked configuration, common faults can be expected particularly in the case of memory cells situated above one another. That is to say that, if a memory cell in a memory cell array is faulty, then there is a particular statistical probability of expectation that the memory cell situated below it or above it is likewise faulty. Such statistical probability can be used to define particular units of memory cells in which relatively frequent fault couplings can be observed. According to the invention, such normal units are repaired jointly by one redundant unit.

In a faulty memory cell array in which the memory cells are each connected to a row line and to a column line, when multiple operating faults arise, significant large numbers of the operating faults can usually be detected along column lines or row lines. Thus, by way of example, in the case of a faulty sense amplifier, the operability of the column line connected to that sense amplifier is affected, and therefore all of the memory cells connected thereto. Similar effects of fault couplings can also be observed in three-dimensional configurations of memory cell arrays. Thus, in particular, manufacture-related effects are conceivable which jointly affect memory cells situated above one another in particular (e.g. deposits of particles on the surface of the semiconductor chip). It is thus possible to reduce the number of fuse banks to be provided by a particular factor without restricting the repair options by the same factor, by taking statistical fault couplings into account.

In accordance with another feature of the invention, one of the normal units and one of the redundant units respectively include memory cells from memory cell arrays respectively disposed in the same levels. This ensures, in particular, that the redundant memory cells have the same physical configuration as the normal memory cells to be replaced. This allows "positionally correct" repair.

In accordance with a concomitant mode of the invention, a memory cell in a first memory cell array, for example, is replaced by a redundant memory cell in one of the memory cell arrays which is disposed in the same level as the first memory cell array. That is to say that memory cells in a particular level are replaced only by redundant memory cells in the same level.

Other features which are considered as characteristic for the invention are set forth in the appended claims.

Although the invention is illustrated and described herein as embodied in an integrated semiconductor memory having memory cells in a plurality of memory cell arrays and a method for repairing such a memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a diagrammatic, perspective view of an exemplary embodiment of an MRAM memory having memory cell arrays in a stacked configuration.

Figure 1:
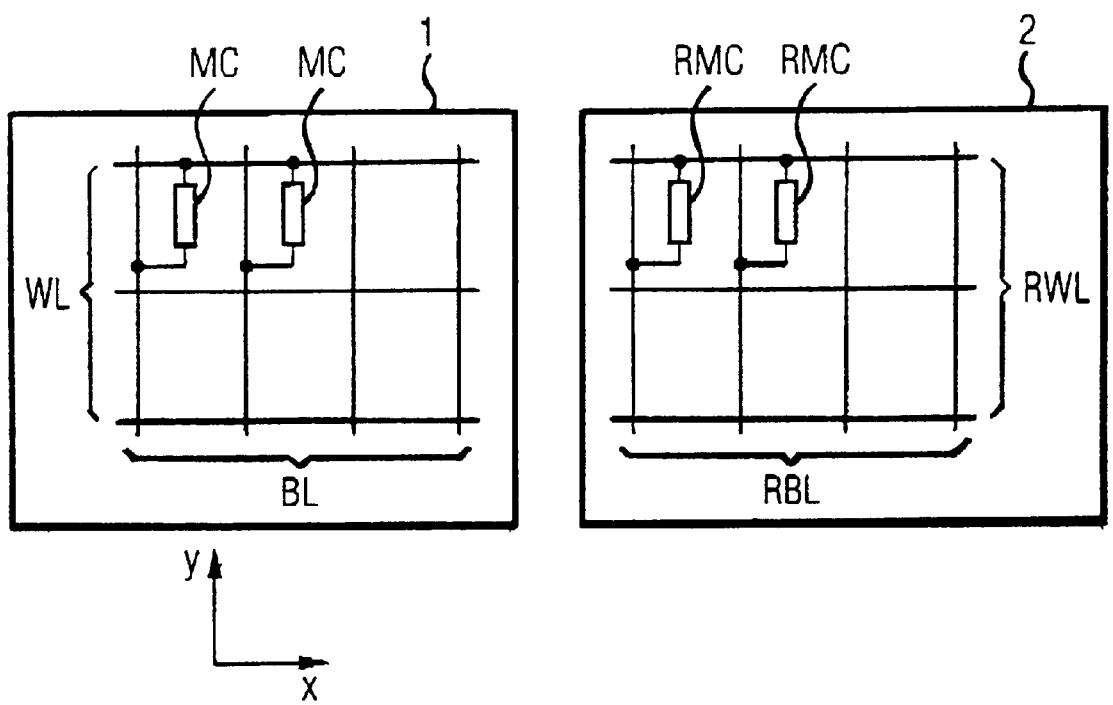
FIG. 1 is a schematic circuit diagram of an exemplary embodiment of an MRAM memory.

DESCRIPTION OF THE PREFERRED EMBODIMENTS:

Referring now to the figures of the drawings in detail and first, particularly, to FIG. 1 thereof, there is seen an exemplary embodiment of an MRAM memory containing memory cells with a magnetoresistive memory effect. All known GMR/TMR elements are suitable as the memory cells, provided that they have a higher impedance than column lines and row lines. In this case, the memory has an illustrative number of row lines WL and column lines BL. Memory cells MC, which are disposed in a two-dimensional matrix-like memory cell array 1, are each connected between a respectively one of the column lines BL and a respectively one of the row lines WL. The memory also has a matrix-like memory cell array 2 containing redundant magnetoresistive memory cells RMC for replacing normal memory cells MC. In a similar way to the memory cells MC, the redundant memory cells RMC are each connected between a respectively one of redundant row lines RWL and a respectively one of redundant column lines RBL.

FIG. 2 is a highly diagrammatic illustration of a configuration of an MRAM memory having memory cell arrays in a stacked configuration. In this context, memory cell arrays 31 to 36 have a structure like the memory cell array 1 of FIG. 1. Memory cell arrays 41 to 46 have a structure like the memory cell array 2 of FIG. 1. The memory cell arrays 31 to 36 and 41 to 46 are disposed on a semiconductor chip 10 in respective levels 1 to 6 running above one another. Within the memory cell arrays 31 to 33, a particular number of memory cells MC is combined to form a normal unit B1 of memory cells. Similarly thereto, memory cells MC in the memory cell arrays 34 to 36 are combined to form a unit B2. Redundant memory cells RMC in the memory cell arrays 41 to 43 are combined to form a redundant unit RB1 of memory cells for replacing a respective one of the normal units B1 or B2. Similarly thereto, memory cells RMC in the memory cell arrays 44 to 46 are combined to form a redundant unit RB2.

In this context, the two-dimensional memory cell arrays in FIGS. 1 and 2 extend in the x-direction and the y-direction of a Cartesian coordinate system. The memory cell arrays shown in FIG. 2 are stacked above one another in the z-direction of the coordinate system, which is perpendicular to the x-direction and the y-direction.

The memory is subjected to a memory cell test in order to check the operability of the memory cells MC in the memory. During such a test mode for checking the memory cells, test data are written to each individual memory cell and are read again, for example. A comparison between the written data and the data which are read again indicates whether or not there is any operating fault. In the present memory there is, in particular, a statistical probability that fault couplings will arise for memory cells situated above one another. In the example shown in FIG. 2, this is illustrated by memory cells MC1 and MC2 in the memory cell arrays 35 and 36 using a coupling K. In the operating test, the memory cell MC1 is detected as faulty and the memory cell MC2 situated below it is likewise faulty. Repair is initiated by the actual detection of the faulty memory cell MC1 or MC2.

A fuse bank 21 is provided for replacing the normal unit B2. This fuse bank 21 has, for example, programmable elements in the form of laser fuses used for storing the address of the unit B2 to be replaced. Thus, only one fuse bank 21 is necessary for replacing the faulty memory cells MC1 and MC2 in the memory cell arrays 35 and 36.

Combining memory cells situated above one another thus permits a space-saving configuration of fuse banks, since the number thereof is reduced. A further fuse bank 22 is provided for storing the address of the unit B1 if it likewise needs to be replaced.

The fuse banks 21 and 22 cannot be stacked above one another, since they must be accessible from above, in particular for supplying a laser beam. Overall, six memory cell arrays require only two fuse banks for programming the repair information.

The relevant unit B2 is advantageously replaced by the redundant unit RB2 in order to repair the faulty memory cell MC1. Since the redundant memory cells are physically disposed in the same levels as the memory cells to be replaced, "positionally correct" repair is ensured. For this purpose, the faulty memory cell MC1 in the memory cell array 35 is replaced by a corresponding memory cell RMC in the memory cell array 45. In this case, the memory cell arrays 35 and 45 are situated in the same level 5. Likewise, the memory cell arrays 34 and 44 are disposed in the same level 4, and the memory cell arrays 36 and 46 are disposed in a common level 6. This means that the normal unit B2 and the redundant unit RB2 respectively include memory cells from memory cell arrays which are respectively disposed in the same levels.

Figure 3:
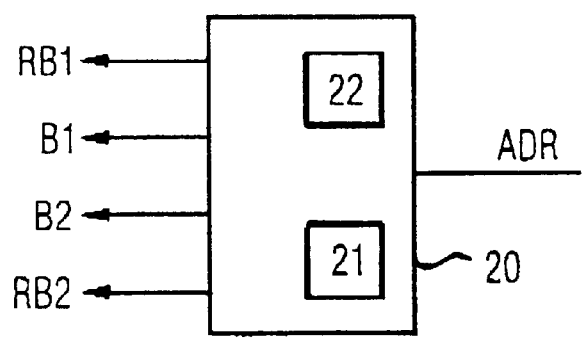
FIG. 3 is a block diagram of an embodiment of a redundancy circuit.

FIG. 3 shows an embodiment of a redundancy circuit 20 containing the fuse banks 21 and 22 of FIG. 2. When the semiconductor memory is operating, in the course of a memory access operation, the normal unit B2 to be replaced is replaced by the redundant unit RB2 through the use of addressing. At the start of a memory access operation, a redundancy evaluation is carried out in the redundancy circuit 20. To this end, an address for the selected normal unit B2 is applied to an address bus ADR, whereupon the applied address is compared with addresses stored in the fuse banks 21 and 22 for faulty normal units. In the example, the address of the normal unit B2 is stored in the fuse bank 21. If the address applied to the address bus ADR matches the address stored in the fuse bank 21, the redundant unit RB2 is selected and the normal unit B2 is deactivated. The procedure is the same if there is a corresponding match with the units RB1 and B1.

I claim:

1. An integrated semiconductor memory, comprising:
   memory cells disposed in a plurality of memory cell arrays;
   a semiconductor chip on which said memory cell arrays are disposed in levels extended above one another;
   said memory cells including a plurality of memory cells combined to form addressable normal units of memory cells;
   said memory cells including a plurality of memory cells combined to form redundant units of memory cells each for jointly replacing a respective one of said normal units; and
   said normal units and said redundant units each having memory cells of said memory cell arrays in a plurality of said levels.

2. The integrated semiconductor memory according to claim 1, wherein one of said normal units and one of said redundant units respectively include memory cells from said memory cell arrays disposed in the same levels.

3. The integrated semiconductor memory according to claim 1, including:
   a redundancy circuit for selecting one of said redundant units and for deactivating one of said normal units to be replaced; and
   said redundancy circuit having a memory unit for storing an address for said one normal unit to be replaced by said one redundant unit.

4. The integrated semiconductor memory according to claim 3, wherein said memory unit has programmable elements in the form of laser fuses.

5. The integrated semiconductor memory according to claim 1, wherein said memory cell arrays each have a plurality of column lines and a plurality of row lines, and said memory cells have a magnetoresistive memory effect and are each connected between a respective one of said plurality of column lines and a respective one of said plurality of row lines of a respective one of said memory cell arrays.

6. A method for repairing an integrated semiconductor memory, which comprises:
   providing memory cells disposed in a plurality of memory cell arrays;
   providing a semiconductor chip on which the memory cell arrays are disposed in levels extended above one another;
   providing the memory cells with a plurality of memory cells combined to form addressable normal units of memory cells;
   providing the memory cells with a plurality of memory cells combined to form redundant units of memory cells each for jointly replacing a respective one of the normal units;
   providing each of the normal units and the redundant units with memory cells of the memory cell arrays in a plurality of the levels;
   testing the memory cells in the memory cell arrays for freedom from fault;
   replacing memory cells detected as faulty with redundant memory cells; and
   replacing a respective normal unit containing a memory cell detected as faulty with one of the redundant units, upon detecting at least one faulty memory cell.

7. The method according to claim 6, which further comprises replacing a memory cell in a given memory cell array with a redundant memory cell in one of the memory cell arrays disposed in the same level as the given memory cell array.

* * * * *

UNITED STATES PATENT AND TRADEMARK OFFICE
CERTIFICATE OF CORRECTION

PATENT NO. : 6,650,577 B2  Page 1 of 1
DATED : November 18, 2003
INVENTOR(S) : Udo Hartmann It is certified that error appears in the above-identified patent and that said Letters Patent is hereby corrected as shown below:

Title page,
Item [56], References Cited, FOREIGN PATENT DOCUMENTS, should read as follows:
-- WO   PCT/DE98/02589   3/1999
　DE   19744095 A1       4/1999 --

Signed and Sealed this

Second Day of March, 2004

JON W. DUDAS
*Acting Director of the United States Patent and Trademark Office*